(12) United States Patent
Ichikawa et al.

(10) Patent No.: US 10,825,985 B2
(45) Date of Patent: Nov. 3, 2020

(54) MAGNETORESISTANCE EFFECT ELEMENT

(71) Applicant: TDK CORPORATION, Tokyo (JP)

(72) Inventors: Shinto Ichikawa, Tokyo (JP);
Katsuyuki Nakada, Tokyo (JP);
Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/451,791

(22) Filed: Jun. 25, 2019

(65) Prior Publication Data

US 2020/0006642 A1    Jan. 2, 2020

(30) Foreign Application Priority Data

Jun. 28, 2018  (JP) ................................. 2018-123538

(51) Int. Cl.
| | | |
|---|---|---|
| *H01L 43/10* | (2006.01) | |
| *G01R 33/09* | (2006.01) | |
| *H01L 43/08* | (2006.01) | |
| *G11B 5/39* | (2006.01) | |
| *H01L 27/22* | (2006.01) | |
| *H01F 10/32* | (2006.01) | |
| *B82Y 25/00* | (2011.01) | |

(52) U.S. Cl.
CPC ............ *H01L 43/10* (2013.01); *G01R 33/098* (2013.01); *G11B 5/3909* (2013.01); *H01F 10/324* (2013.01); *H01L 27/222* (2013.01); *H01L 43/08* (2013.01); *B82Y 25/00* (2013.01)

(58) Field of Classification Search
None
See application file for complete search history.

(56) References Cited

U.S. PATENT DOCUMENTS

| | | | |
|---|---|---|---|
| 2002/0097534 A1* | 7/2002 | Sun ...................... | B82Y 40/00 |
| | | | 360/324.2 |
| 2012/0091548 A1 | 4/2012 | Sukegawa et al. | |
| 2013/0221461 A1* | 8/2013 | Sukegawa ............... | H01L 43/08 |
| | | | 257/421 |
| 2017/0098761 A1* | 4/2017 | Worledge ................ | H01L 43/08 |
| 2017/0170387 A1* | 6/2017 | Kim ...................... | G11C 11/161 |

(Continued)

FOREIGN PATENT DOCUMENTS

| | | | |
|---|---|---|---|
| JP | 5586028 B2 | 9/2014 | |
| JP | 5988019 B2 | 9/2016 | |

OTHER PUBLICATIONS

Sukegawa et al; "Tunnel magnetoresistance with improved bias voltage dependence in lattice-matched Fe/spinel MgAl2O4/Fe(001) junctions;" Applied Physics Letters; vol. 96; pp. 212505-1-212505-3; May 27, 2010.

(Continued)

*Primary Examiner* — Shaun M Campbell
(74) *Attorney, Agent, or Firm* — Oliff PLC (57) ABSTRACT

A magnetoresistance effect element includes a first ferromagnetic layer, a second ferromagnetic layer, and a tunnel barrier layer that is interposed between the first ferromagnetic layer and the second ferromagnetic layer. The tunnel barrier layer is a stacked body including one or more first oxide layers having a spinel structure and one or more second oxide layers having a spinel structure with a composition which is different from a composition of the first oxide layer.

9 Claims, 3 Drawing Sheets

(56) References Cited

U.S. PATENT DOCUMENTS

| | | | |
|---|---|---|---|
| 2018/0026181 A1* | 1/2018 | Sasaki | G01R 33/093 |
| | | | 257/421 |
| 2018/0083186 A1* | 3/2018 | Sasaki | H01L 45/147 |
| 2020/0044144 A1* | 2/2020 | Sukegawa | G01R 33/09 |
| 2020/0091408 A1* | 3/2020 | Sundar | H01F 41/302 |
| 2020/0105999 A1* | 4/2020 | Jeong | H01L 43/10 |

OTHER PUBLICATIONS

Miura et al; "First-principles study of tunneling magnetoresistance in Fe/MgAl2O4/Fe(001) magnetic tunnel junctions;" Physical Review B; vol. 86; pp. 024426-1-024426-6; Jul. 20, 2012.

Scheike et al; "Lattice-matched magnetic tunnel junctions using a Heusler alloy Co2FeAl and a cation-disorder spinel Mg—Al—O barrier;" Applied Physics Letters; vol. 105; pp. 242407-1-242407-5; Dec. 17, 2014.

* cited by examiner

MAGNETORESISTANCE EFFECT ELEMENT

CROSS-REFERENCE TO RELATED APPLICATION

Priority is claimed on Japanese Patent Application No. 2018-123538, filed Jun. 28, 2018, the content of which is incorporated herein by reference.

BACKGROUND OF THE INVENTION

Field of the Invention

The disclosure relates to a magnetoresistance effect element.

Description of Related Art

A giant magnetoresistance (GMR) element including a multilayered film of a ferromagnetic layer and a nonmagnetic layer and a tunneling magnetoresistance (TMR) element using an insulating layer (a tunnel barrier layer, a barrier layer) as a nonmagnetic layer are known. In general, a TMR element has a higher element resistance than a GMR element, but has a higher magnetoresistance (MR) ratio than a GMR element. Accordingly, TMR elements have attracted attention as elements for a magnetic sensor, a high-frequency component, a magnetic head, and a nonvolatile random-access memory (MRAM).

TMR elements can be classified into two types depending on a difference in a mechanism of tunnel conduction of electrons. One type is TMR elements using only a penetration effect (a tunneling effect) of wave functions between ferromagnetic layers. The other type is TMR elements in which coherent tunneling (in which only electrons having symmetry of a specific wave function tunnel) using conduction of a specific orbit of a tunnel barrier layer which is tunneled when a tunneling effect occurs is dominant. It is known that a TMR element in which coherent tunneling is dominant provides a larger MR ratio than a TMR element using only a tunneling effect.

MgO is widely known as a material of a tunnel barrier layer in which a coherent tunneling effect is obtained. However, MgO has a large lattice mismatch with a ferromagnetic layer and many defects such as dislocation are generated in the tunnel barrier layer of MgO and thus there is a problem in that a tunneling junction with high quality cannot be obtained. Accordingly, materials substituting MgO have been studied. For example, Japanese Patent No. 5586028 discloses a magnetoresistance effect element using $MgAl_2O_4$ having a spinel structure as a material substituting MgO.

Japanese Patent No. 5988019 discloses a magnetoresistance effect element using a nonmagnetic oxide having a disordered spinel structure as a tunnel barrier layer. According to Japanese Patent No. 5988019, a higher MR ratio is obtained in the disordered spinel structure in a result of comparison between a case in which a nonmagnetic oxide having a spinel structure is used as a tunnel barrier layer (Japanese Patent No. 5586028) and a case in which a nonmagnetic oxide having a disordered spinel structure is used as a tunnel barrier layer.

SUMMARY OF THE INVENTION

A nonmagnetic oxide having a spinel structure has less lattice mismatch with respect to a ferromagnetic layer, better bias dependency of a voltage, and a higher MR ratio with a high applied voltage in comparison with MgO. Accordingly, a nonmagnetic oxide having a spinel structure is expected to be able to be a material for a tunnel barrier layer of a magnetoresistance effect element for an MRAM which is used with a high applied voltage. In a magnetoresistance effect element for a memory such as an MRAM, it is preferable that an output voltage value be higher such that accurate reading and writing are possible with a relatively high voltage. However, since a nonmagnetic oxide having a spinel structure has a slightly lower MR ratio under a low voltage than MgO, there is a problem in that it is difficult to enhance an output voltage value.

The disclosure is made in consideration of the above-mentioned circumstances and an objective thereof is to provide a magnetoresistance effect element with a high output voltage value.

The inventors have conducted studies to solve the above-mentioned problems and thus found that it is possible to enhance an output voltage value of a magnetoresistance effect element by forming a tunnel barrier layer as a stacked body including one or more first oxide layers having a spinel structure and one or more second oxide layers having a spinel structure with a composition which is different from a composition of the first oxide layer.

That is, the disclosure provides the following means to solve the above-mentioned problems.

(1) According to an aspect of the disclosure, a magnetoresistance effect element is provided, including: a first ferromagnetic layer; a second ferromagnetic layer; and a tunnel barrier layer that is interposed between the first ferromagnetic layer and the second ferromagnetic layer, wherein the tunnel barrier layer is a stacked body including one or more first oxide layers having a spinel structure and one or more second oxide layers having a spinel structure with a composition which is different from a composition of the first oxide layer.

(2) In the magnetoresistance effect element according to the aspect, the first oxide layer may include an oxide containing a metal or an alloy which is expressed by General Formula (I)

$$A_{1-x}B_x \quad (I)$$

the second oxide layer may include an oxide containing a metal or an alloy which is expressed by General Formula (II), $$A_{1-y}B_y \quad (II),$$

and wherein,
in General Formula (I) and General Formula (II),
A's are independently Mg or Zn,
B's are independently at least one type of metal selected from the group consisting of Al, Ga, and In, and
x and y satisfy $0<x\leq1$, $0<y\leq1$, and $|y-x|\geq0.005$.

(3) In the magnetoresistance effect element according to the aspect, x may satisfy $0<x<0.5$ and y may satisfy $0.5<y\leq1$, or x may satisfy $0.5<x\leq1$ and y may satisfy $0<y<0.5$.

(4) In the magnetoresistance effect element according to the aspect, x may satisfy $0<x<0.5$ and y may satisfy $0.5<y<1$.

(5) In the magnetoresistance effect element according to the aspect, the first ferromagnetic layer may be formed on a substrate, the first oxide layer may be stacked on a surface of the first ferromagnetic layer opposite to the substrate, and the second oxide layer may be stacked on a surface of the first oxide layer opposite to the first ferromagnetic layer.

(6) In the magnetoresistance effect element according to the aspect, the tunnel barrier layer may be a stacked body which includes two first oxide layers and in which the second oxide layer is interposed between the two first oxide layers.

(7) In the magnetoresistance effect element according to the aspect, a thickness of the first oxide layer may be thinner than a thickness of the second oxide layer.

(8) In the magnetoresistance effect element according to the aspect, a thickness of the tunnel barrier layer may be equal to or less than 3 nm.

(9) In the magnetoresistance effect element according to the aspect, the first oxide layer and the second oxide layer may have a disordered spinel structure.

According to the disclosure, it is possible to provide a magnetoresistance effect element with a high output voltage value.

DETAILED DESCRIPTION OF THE INVENTION

Hereinafter, the disclosure will be described in detail with reference to the accompanying drawings. In the drawings used for the following description, feature parts may be enlarged for the purpose of convenience and dimensional ratios of elements or the like may be different from actual values. Materials, dimensions, and the like which are described in the following description are examples, and the disclosure is not limited thereto and can be appropriately modified without departing from the gist of the disclosure.

First Embodiment

Figure 1:
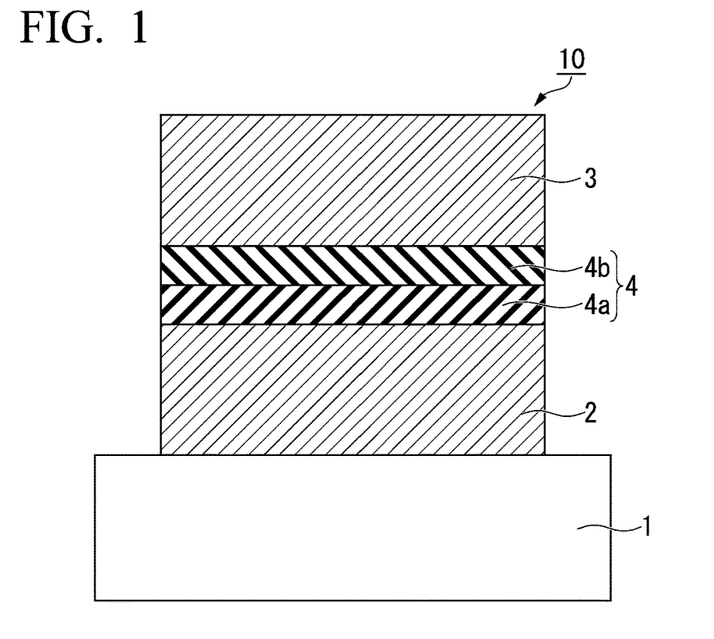
FIG. 1 is a sectional view schematically illustrating a magnetoresistance effect element according to a first embodiment of the disclosure.

FIG. 1 is a sectional view schematically illustrating a magnetoresistance effect element according to a first embodiment of the disclosure. The magnetoresistance effect element 10 illustrated in FIG. 1 includes a substrate 1, a first ferromagnetic layer 2, a second ferromagnetic layer 3, and a tunnel barrier layer 4. The magnetoresistance effect element 10 may include a cap layer and a buffer layer in addition to the above-mentioned layers.

Substrate

It is preferable that the substrate 1 have excellent flatness. For example, MgO, Si, or AlTiC can be used as the material of the substrate 1.

First Ferromagnetic Layer and Second Ferromagnetic Layer

The first ferromagnetic layer 2 and the second ferromagnetic layer 3 have magnetization. The magnetoresistance effect element 10 outputs a change in relative angle of the magnetization as a change in resistance value. For example, when a magnetization direction of the second ferromagnetic layer 3 is fixed and a magnetization direction of the first ferromagnetic layer 2 is set to be variable with respect to the magnetization direction of the second ferromagnetic layer 3, the magnetization direction of the first ferromagnetic layer 2 changes and thus the resistance value of the magnetoresistance effect element 10 changes. A layer in which a magnetization direction is fixed is generally referred to as a fixed layer, and a layer in which a magnetization direction is variable is generally referred to as a free layer. Since the change in resistance value is caused according to a change in relative angle of magnetization, a configuration in which none of the magnetization of the first ferromagnetic layer 2 and the second ferromagnetic layer 3 is fixed may be employed.

The first ferromagnetic layer 2 and the second ferromagnetic layer 3 include a ferromagnetic material. Examples of the ferromagnetic material include a metal which is selected from the group consisting of Cr, Mn, Co, Fe, and Ni, an alloy including one or more kinds of metal which are selected from this group, and an alloy including one or more metals selected from this group and one or more kinds of element from B, C, and N. Particularly, Fe or a CoFe alloy has high spin polarizability and can increase an MR ratio of the magnetoresistance effect element 10 when it is used for the first ferromagnetic layer 2 or the second ferromagnetic layer 3. Examples of the first ferromagnetic layer 2 and the second ferromagnetic layer 3 include Co—Fe, Co—Fe—B, and Ni—Fe. When the first ferromagnetic layer 2 and the second ferromagnetic layer 3 are in-plane magnetized films, for example, a Co—Ho alloy ($CoHo_2$) or an Sm—Fe alloy ($SmFe_{12}$) can be preferably used.

The first ferromagnetic layer 2 and the second ferromagnetic layer 3 may be formed of a Heusler alloy such as $Co_2FeSi$. A Heusler alloy has high spin polarizability and can realize a high MR ratio. A Heusler alloy contains an intermetallic compound having a chemical composition of XYZ or $X_2YZ$. Here, X is a transition metal element or a noble metal element in the Co, Fe, Ni, or Cu group. Y is a transition metal in the Mn, V, Cr, or Ti group or the same elements as X. Z is a typical element in Groups III to V. For example, $Co_2FeSi$, $Co_2FeGe$, $Co_2FeGa$, $Co_2MnSi$, $Co_2Mn_{1-a}Fe_aAl_bSi_{1-b}$, or $Co_2FeGe_{1-c}Ga_c$ can be used as the Heusler alloy. The Heusler alloy has high spin polarizability and can increase the MR ratio of the magnetoresistance effect element 10.

When the magnetization directions of the first ferromagnetic layer 2 and the second ferromagnetic layer 3 are set to be perpendicular to the stacked surface, it is preferable that the thickness be equal to or less than 3 nm. Perpendicular magnetic anisotropy is applied to the first ferromagnetic layer 2 and the second ferromagnetic layer 3 at an interface with the tunnel barrier layer 4. Since the effect of perpendicular magnetic anisotropy is attenuated by increasing the thicknesses of the first ferromagnetic layer 2 and the second ferromagnetic layer 3, it is preferable that the thicknesses of the first ferromagnetic layer 2 and the second ferromagnetic layer 3 be small.

When the first ferromagnetic layer 2 is formed as a fixed layer and the second ferromagnetic layer 3 is formed as a free layer, a coercive force of the first ferromagnetic layer 2 is set to be greater than a coercive force of the second ferromagnetic layer 3. A difference in coercive force can be adjusted using materials constituting the ferromagnetic layers, layers adjacent to the ferromagnetic layers, or the like. For example, a material having a greater coercive force than a material constituting the second ferromagnetic layer 3 may be used for the first ferromagnetic layer 2 or an antiferromagnetic material such as IrMn or PtMn may be made to be adjacent to the first ferromagnetic layer 2. In order to prevent a magnetic field leaking from the first ferromagnetic layer 2 from affecting the second ferromagnetic layer 3, a combined ferromagnetic coupling structure may be employed.

Tunnel Barrier Layer

The tunnel barrier layer 4 is formed as a stacked body including a first oxide layer 4a and a second oxide layer 4b which is stacked on the surface (the top surface in FIG. 1) of the first oxide layer 4a opposite to the first ferromagnetic layer 2. The first oxide layer 4a and the second oxide layer 4b have a spinel structure. A nonmagnetic oxide having a spinel structure generally includes two kinds of metallic elements including element A and element B and is expressed by a composition formula $AB_2O_4$. The spinel structure of the first oxide layer 4a and the second oxide layer 4b is not limited to a regular spinel structure and also includes a disordered spinel structure.

Figure 2:
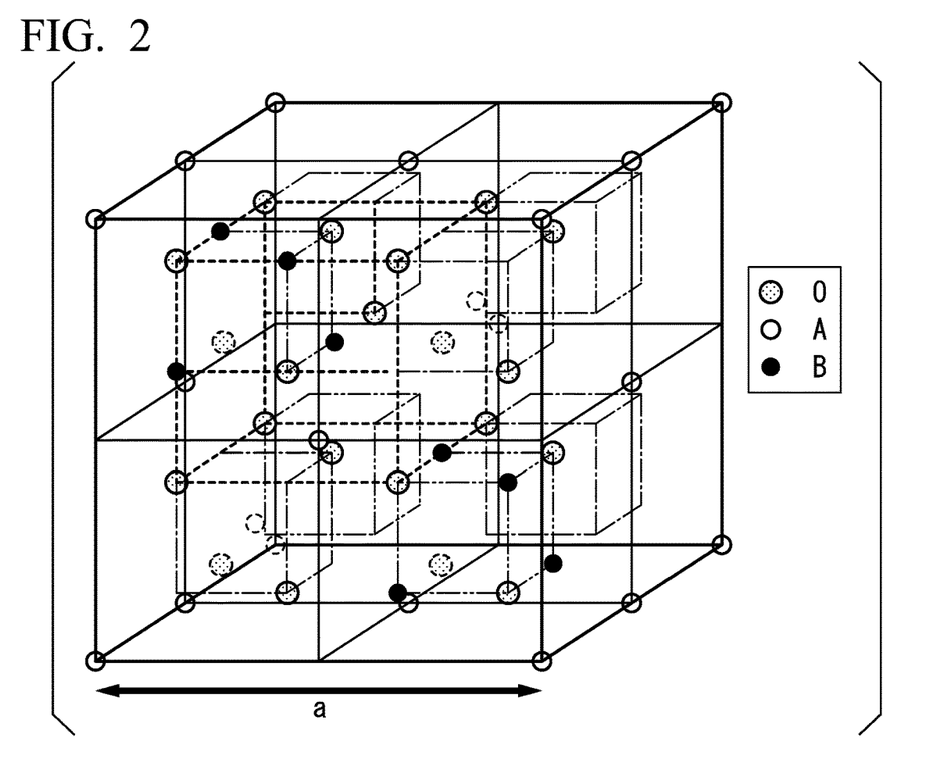
FIG. 2 is a diagram illustrating a crystal structure of a spinel structure.

FIG. 2 is a diagram schematically illustrating a crystal structure of a regular spinel structure. In the regular spinel structure, as illustrated in FIG. 2, a site which element A enters (A site) and a site which element B enters (B site) are fixed and an arrangement of these elements is regular.

Figure 3:
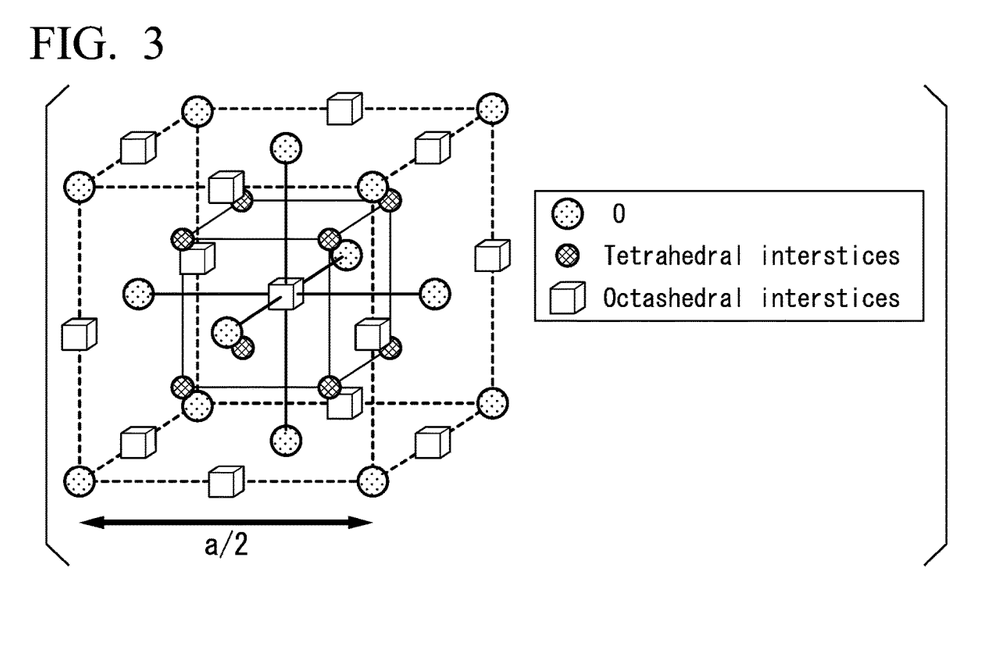
FIG. 3 is a diagram illustrating a crystal structure of a disordered spinel structure.

On the other hand, FIG. 3 is a diagram schematically illustrating a crystal structure of a disordered spinel structure. In the disordered spinel structure, element A or element B can be present in any of a site (site A) coordinating tetrahedrally with oxygen and a site (site B) coordinately octahedrally with oxygen which are illustrated in FIG. 3. The site which element A or element B enters is randomly determined. When element A and element B having different atom radii enter the sites, the crystal structure becomes irregular. A lattice constant (a/2) of a disordered spinel structure is substantially a half of a lattice constant (a) of a regular spinel structure.

The first oxide layer 4a and the second oxide layer 4b have different compositions. The different compositions include the following three cases. The first case is a case in which the kinds of metal elements which are included in the first oxide layer 4a and the second oxide layer 4b are the same and content proportions of the metal elements are different from each other. The second case is a case in which the content proportions of metal elements which are included in the first oxide layer 4a and the second oxide layer 4b are the same and the kinds of the metal elements are different from each other. The third case is a case in which both the kinds and the content proportions of metal elements which are included in the first oxide layer 4a and the second oxide layer 4b are different from each other. In the magnetoresistance effect element 10 according to this embodiment, since the tunnel barrier layer 4 is formed as a stacked body including one or more layers of the first oxide layer 4a and one or more layers of the second oxide layer 4b, which have different compositions, an output voltage value is improved. The reason therefor has not been fully elucidated but is thought to be as follows.

An output voltage value $V_{output}$ of the magnetoresistance effect element 10 is a maximum value of values which are calculated using Equation (1).

$$V_{output}(V) = \frac{1}{2} V_{Bias} \frac{TMR(V)}{1 + TMR(V)} \quad (1)$$

In Equation (1), $V_{Bias}$ is a bias voltage which is applied to the magnetoresistance effect element 10.

TMR(V) denotes an MR ratio when a bias voltage is applied to the magnetoresistance effect element 10. An MR ratio decreases as the applied bias voltage increases.

The maximum value of the output voltage value $V_{output}$ can be calculated by measuring the MR ratio while changing the bias voltage value $V_{Bias}$.

In order to increase the output voltage value $V_{output}$ of the magnetoresistance effect element 10, it is effective to increase the MR ratio and the bias voltage value $V_{half}$. $V_{half}$ is a voltage when the MR ratio at the time of application of the bias voltage is half the MR ratio at the time of application of a low bias and is an indicator of the quantity of decrease in MR ratio.

The MR ratio and $V_{half}$ of the magnetoresistance effect element 10 vary greatly depending on the composition of the tunnel barrier layer 4. In general, the tunnel barrier layer 4 (for example, MgO) having a composition which is effective for improvement in MR ratio is likely to be less effective in improving $V_{half}$, and the tunnel barrier layer 4 (for example, spinel) having a composition which is effective for improvement in $V_{half}$ is likely to be less effective in improving the MR ratio. In the magnetoresistance effect element 10 according to this embodiment, by forming the tunnel barrier layer 4 as a stacked body including an oxide film having a composition which is effective for improvement in MR ratio and an oxide film having a composition which is effective for improvement in $V_{half}$, it is possible to improve the MR ratio and $V_{half}$ with good balance. Accordingly, the output voltage value in the magnetoresistance effect element 10 according to this embodiment is improved.

The first oxide layer 4a includes an oxide containing a metal or an alloy which is expressed by General Formula (I), and the second oxide layer 4b includes an oxide containing a metal or an alloy which is expressed by General Formula (II).

$$A_{1-x}B_x \quad (I)$$

$$A_{1-y}B_y \quad (II),$$

Here, in General Formula (I) and General Formula (II), A's are independently Mg or Zn, B's are independently at least one type of metal selected from the group consisting of Al, Ga, and In, and x and y satisfy $0<x\leq1$, $0<y\leq1$, and $|y-x|\geq0.005$. When x or y is 1, it is preferable that element B be Al. The first oxide layer 4a or the second oxide layer 4b which is formed of an oxide of Al is a γ-alumina layer and is preferably an oxide layer having a disordered spinel structure in which Al randomly enters A sites and B sites.

By setting the relationship between x and y to $|y-x|\geq0.005$, it is possible to form one of the first oxide layer 4a and the second oxide layer 4b as an oxide film having a composition which is effective for improvement in MR ratio and to form the other as an oxide film having a composition which is effective for improvement in $V_{half}$. When $|y-x|$ is excessively large, there is concern that lattice matching of the first oxide layer 4a and the second oxide layer 4b will decrease. Accordingly, it is preferable that x and y satisfy $|y-x|\leq0.8$. When $|y-x|\geq0.005$ is satisfied, the kinds of element A and element B which are included in the first oxide layer 4a and the second oxide layer 4b, respectively, may be the same as or different from each other.

It is preferable that x satisfy $0<x<0.5$ and y satisfy $0.5<y\leq1$ or that x satisfy $0.5<x\leq1$ and y satisfy $0<y<0.5$. That is, it is preferable that one of the first oxide layer 4a and the second oxide layer 4b contain more element A than element B and the other contain more element B than element A. In this case, the difference in composition between the first oxide layer 4a and the second oxide layer 4b increases and the output voltage value is more reliably improved. In general, an oxide layer containing more element A than element B is effective for improvement in MR ratio. On the other hand, an oxide layer containing more element B than element A is effective for improvement in $V_{half}$.

An oxide layer containing more element A than element B is generally likely to have higher crystallinity than an oxide layer containing more element B than element A. Accordingly, it is preferable that an oxide layer containing more element A than element B be disposed on the substrate 1 side. That is, in the magnetoresistance effect element 10 according to this embodiment, it is preferable that the first oxide layer 4a be formed as an oxide layer containing more element A than element B and the second oxide layer 4b be formed as an oxide layer containing more element B than element A. By improving crystallinity of the first oxide layer 4a, it is possible to improve lattice matching between the first ferromagnetic layer 2 and the first oxide layer 4a. When the magnetoresistance effect element 10 is manufactured, the first ferromagnetic layer 2, the first oxide layer 4a, the second oxide layer 4b, and the second ferromagnetic layer 3 are sequentially stacked in this order from the substrate 1. Accordingly, by forming the first oxide layer 4a which is first stacked as an oxide layer containing more element A having high crystallinity than element B, it is possible to improve crystallinity of the second oxide layer 4b which is stacked later.

When the first oxide layer 4a is formed as an oxide layer containing more element A than element B, it is preferable that the thickness of the first oxide layer 4a be less than the thickness of the second oxide layer 4b. Specifically, it is preferable that the thickness of the first oxide layer 4a be equal to or less than 1 nm. By decreasing the thickness of the first oxide layer 4a, it is possible to further improve crystallinity of the first oxide layer 4a.

It is preferable that the thickness of the tunnel barrier layer 4 be equal to or less than 3 nm. When the thickness of the tunnel barrier layer 4 is equal to or less than 3 nm, wave functions of the first ferromagnetic layer 2 and the second ferromagnetic layer 3 are likely to overlap over the tunnel barrier layer 4 and a tunneling effect and a coherent tunneling effect of the wave functions between the ferromagnetic layers are more easily obtained.

Shape and Dimensions of Element

The stacked body including the first ferromagnetic layer 2, the tunnel barrier layer 4, and the second ferromagnetic layer 3 which constitute the magnetoresistance effect element 10 has a pillar shape. The shape of the stacked body in plan view can have various shapes such as a circle, a tetragon, a triangle, and a polygon and is preferably a circle in view of symmetry. That is, the stacked body preferably has a columnar shape.

When the stacked body has a columnar shape, the diameter thereof in plan view is preferably equal to or less than 80 nm, more preferably equal to or less than 60 nm, and still more preferably equal to or less than 30 nm. When the diameter is equal to or less than 80 nm, a domain structure is not likely to be formed in the ferromagnetic layers, and it is not necessary to consider a component which is different from spin polarization in the ferromagnetic metal layers. In the case where the diameter is 30 nm or less, a single domain structure is formed in the ferromagnetic layers, and a speed or a probability of a magnetization reversal is improved. When the diameter is equal to or less than 30 nm, a single domain structure is formed in the ferromagnetic layer and a magnetization switching speed or probability is improved. In a miniaturized magnetoresistance effect element, there is strong demand for a decrease in resistance.

Method of Manufacturing Magnetoresistance Effect Element

A method of manufacturing a magnetoresistance effect element will be described below.

The method of manufacturing a magnetoresistance effect element according to this embodiment includes a step of stacking the first ferromagnetic layer, the tunnel barrier layer, and the second ferromagnetic layer. Known methods such as a sputtering method, a vapor deposition method, a laser ablation method, and a molecular beam epitaxial (MBE) method can be used as the method of forming the layers.

The tunnel barrier layer is formed by first stacking the first oxide layer and then stacking a second oxide layer thereon. The first oxide layer and the second oxide layer can be formed using a method including a step of forming a metal film, a step of oxidizing the formed metal film to acquire an oxide film, and performing a heat treatment on the oxide film.

Known methods such as a sputtering method, a vapor deposition method, a laser ablation method, and a molecular beam epitaxial (MBE) method can be used as the method of forming the metal film. For example, the first oxide layer can be formed using a method of performing sputtering using a target containing a metal or alloy which is expressed by General Formula (I). The second oxide layer can be formed using a method of performing sputtering using a target containing a metal or alloy which is expressed by General Formula (II).

A plasma oxidation method or a natural oxidation method based on introduction of oxygen can be used as the method of oxidizing the metal film. The heat treatment of the oxide film varies depending on a composition of the oxide and is preferably performed in a vacuum at a temperature range of 350° C. or more and 500° C. or less in general.

The method of forming the tunnel barrier layer is not limited to the above-mentioned method. For example, the metal film may be formed using a method of performing co-sputtering using a target containing element A and a target containing element B. The oxide film may be directly formed using a target of an oxide containing element A and element B. Alternatively, the oxide film may be formed while oxidizing the metal film using a reactive film formation method.

As described above, in the magnetoresistance effect element 10 according to the first embodiment, the tunnel barrier layer 4 is formed as a stacked body including one first oxide layer 4a having a spinel structure and one second oxide layer 4b having a spinel structure with a composition which is different from a composition of the first oxide layer. Accordingly, by forming one of the first oxide layer 4a and the second oxide layer 4b as an oxide film having a composition which is effective for improvement in MR ratio and forming the other as an oxide film having a composition which is effective for improvement in $V_{half}$, it is possible to improve the MR ratio and $V_{half}$ of the magnetoresistance effect element 10 with good balance and thus to improve the output voltage value.

Second Embodiment

Figure 4:
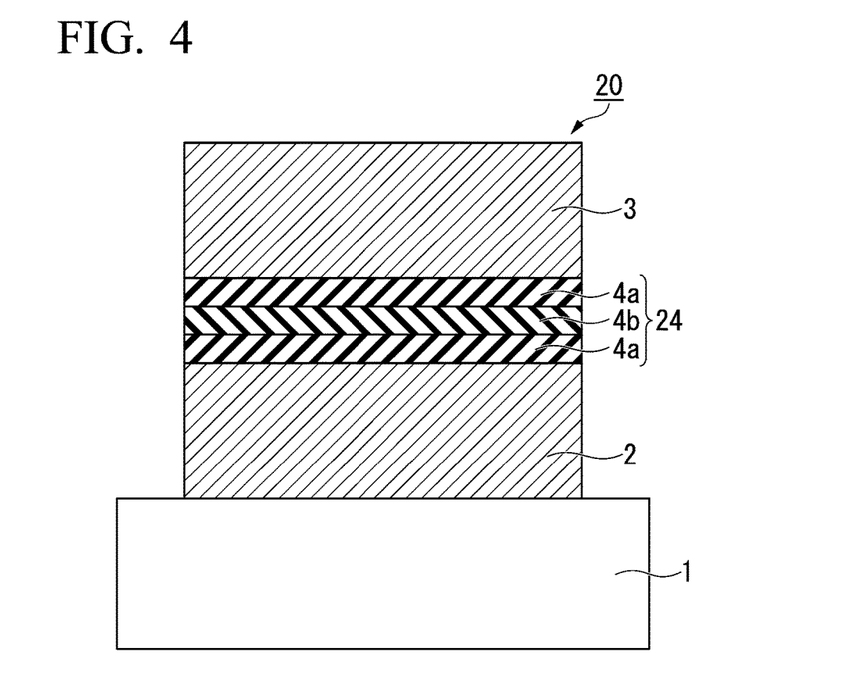
FIG. 4 is a sectional view schematically illustrating a magnetoresistance effect element according to a second embodiment of the disclosure.

FIG. 4 is a sectional view schematically illustrating a magnetoresistance effect element according to a second embodiment of the disclosure. In the magnetoresistance effect element 20 according to the second embodiment, the same elements as in the magnetoresistance effect element 10 according to the first embodiment will be referred to by the same reference signs and description thereof will not be repeated.

In the magnetoresistance effect element 20 illustrated in FIG. 4, a tunnel barrier layer 24 is a stacked body which includes two first oxide layers 4a and in which a second oxide layer 4b is interposed between the two first oxide layers 4a. The first oxide layer 4a contains element A and element B at an atomic ratio (element A:element B) of 1−x:x (0<x≤1) and the second oxide layer 4b contains element A and element B at an atomic ratio (element A:element B) of 1−y:y (0<y≤1), where x and y satisfy |y−x|≥0.005. That is, the two first oxide layers 4a are oxide layers containing more element A in comparison with the second oxide layer 4b and thus have higher crystallinity. The compositions of the two first oxide layers 4a may be the same as or different from each other. For example, the proportions of element A and element B in the two first oxide layers 4a may be different from each other and the kinds of element A and/or element B therein may be different.

Since the first oxide layer 4a has higher crystallinity than the second oxide layer 4b, lattice matching between the first ferromagnetic layer 2 and the first oxide layer 4a and between the first oxide layer 4a and the second ferromagnetic layer 3 is improved. By interposing the second oxide layer 4b between the first oxide layers 4a having high crystallinity, the crystallinity of the second oxide layer 4b is improved.

Since the magnetoresistance effect element 20 includes two first oxide layers 4a, the thickness per layer can be decreased. It is preferable that the thickness of one layer of the first oxide layers 4a be equal to or less than 0.5 nm. In this case, the crystallinity of the first oxide layer 4a is further improved.

Others

The magnetoresistance effect element 10 may have one of a top pin structure in which a magnetization-fixed layer is disposed farther from a substrate than a magnetization-free layer and a bottom pin structure in which a magnetization-fixed layer is disposed closer to a substrate than a magnetization-free layer.

The tunnel barrier layer 4 in the magnetoresistance effect element 10 according to the first embodiment is formed as a stacked body of one first oxide layer 4a and one second oxide layer 4b, and the tunnel barrier layer 24 in the magnetoresistance effect element 20 according to the second embodiment is formed as a stacked body of two first oxide layers 4a and one second oxide layer 4b. The numbers of the first oxide layers 4a and the second oxide layers 4b are not particularly limited as long as one or more layers thereof are included. For example, the number of first oxide layers 4a may be three and the number of second oxide layers 4b may be two. It is preferable that an oxide layer having higher crystallinity be disposed to be in contact with the first ferromagnetic layer 2 and the second ferromagnetic layer 3. It is preferable that the thickness of the tunnel barrier layer as a whole be equal to or less than 3 nm.

The tunnel barrier layer 4 or 24 may include a third oxide layer having a composition which is different from those of the first oxide layer 4a and the second oxide layer 4b. In this case, it is preferable that the third oxide layer have an intermediate composition between that of the first oxide layer 4a and that of the second oxide layer 4b and be interposed between the first oxide layer and the second oxide layer.

As described above, the magnetoresistance effect elements according to the embodiments can be effectively used as a memory such as an MRAM.

EXAMPLES

Examples 1 to 30 and Comparative Examples 1 to 19

The magnetoresistance effect element 10 illustrated in FIG. 1 was manufactured. First, a MgO (001) single-crystal substrate was prepared as a substrate 1, a Cr layer with a thickness of 40 nm was formed as a buffer layer (also serving as a first wire 31 which will be described later) on the substrate 1, and an Fe layer with a thickness of 30 nm was stacked as the first ferromagnetic layer 2 thereon.

Then, an $Mg_{1-x}Al_x$ alloy film which is expressed by a general formula $Mg_{1-x}Al_x$ (where x has a value described in Table 1A and Table 1B) was formed in a thickness of 0.8 nm on the first ferromagnetic layer 2 using a sputtering method. Subsequently, the alloy film was oxidized to form an oxide film and a heat treatment was performed thereon to form a first oxide layer 4a. The oxidization process was performed by exposing the alloy film to the air under a pressure of 5 Pa for 600 seconds. The heat treatment was performed by heating the oxide film in a vacuum at 400° C. for 15 minutes. Subsequently, an $Mg_{1-y}Al_y$ alloy film which is expressed by a general formula $Mg_{1-y}Al_y$ (where y has a value described in Table 1A and Table 1B) was formed in a thickness of 0.8 nm on the first oxide layer 4a using a sputtering method, the alloy film was oxidized to form an oxide film, and a heat treatment was performed thereon to form a second oxide layer 4b. The conditions of the oxidization process and the heat treatment were set to be the same as in the first oxide layer 4a. In this way, a tunnel barrier layer 4 which is a stacked body including the first oxide layer 4a and the second oxide layer 4b was stacked on the first ferromagnetic layer 2.

Then, an Fe layer was stacked in a thickness 6 nm as a second ferromagnetic layer 3 on the tunnel barrier layer 4 to obtain a ferromagnetic tunnel junction. An IrMn layer was formed in a thickness of 12 nm as an antiferromagnetic layer on the second ferromagnetic layer 3, and an Ru layer was formed in a thickness of 20 nm as a cap layer (also serving as a second wire 32 which will be described later) thereon to obtain a magnetoresistance effect element 10. Finally, the resultant was heated at a temperature of 175° C. while applying a magnetic field of 5 kOe thereto, whereby uniaxial magnetic anisotropy was given to the second ferromagnetic layer 3.

As described above, the magnetoresistance effect element 10 in which the tunnel barrier layer 4 is a stacked body including the first oxide layer 4a and the second oxide layer 4b having the compositions which are described in Table 1A and Table 1B was manufactured.

In the manufactured magnetoresistance effect element 10, content proportions (atomic ratios) of Mg and Al in the first oxide layer 4a and the second oxide layer 4b of the tunnel barrier layer were measured as follows. As a result, it was ascertained that the content proportions of Mg and Al in the first oxide layer 4a were almost the same as that in the $Mg_{1-x}Al_x$ alloy film and the content proportions of Mg and Al in the second oxide layer 4b were almost the same as that in the $Mg_{1-y}Al_y$ alloy film.

Method of Measuring Content Proportions of Mg and Al

The magnetoresistance effect element 10 was cut along a plane parallel to the stacking direction thereof using a focused ion beam to manufacture thin sample pieces of the tunnel barrier layer. The composition of the thin sample pieces was analyzed by energy-dispersive X-ray analysis (EDS) in a transmission electron microscope (TEM). The analysis method is not limited thereto, and a secondary ion mass spectroscopy (SIMS), an atom probe method, or an electron energy loss spectroscopy (EELS) may be used.

The crystal structure of the tunnel barrier layer 4 in the manufactured magnetoresistance effect element 10 was ascertained by section TEM observation. As a result, it was ascertained that both the oxide of the $Mg_{1-x}Al_x$ alloy film in which x was in the range of 0.25 to 1.00 and the oxide of the $Mg_{1-y}Al_y$ in which y was in the range of 0.25 to 1.00 had a disordered spinel structure. On the other hand, it was ascertained that both the oxide of the Mg film in which x was 0.00 and the oxide of the Mg film in which y was 0.00 had a rock salt structure and were MgO.

An output voltage value $V_{output}$ of the manufactured magnetoresistance effect element 10 was measured as follows. The results are described in Table 1A and Table 1B.

Method of Measuring Output Voltage Value

Figure 5:
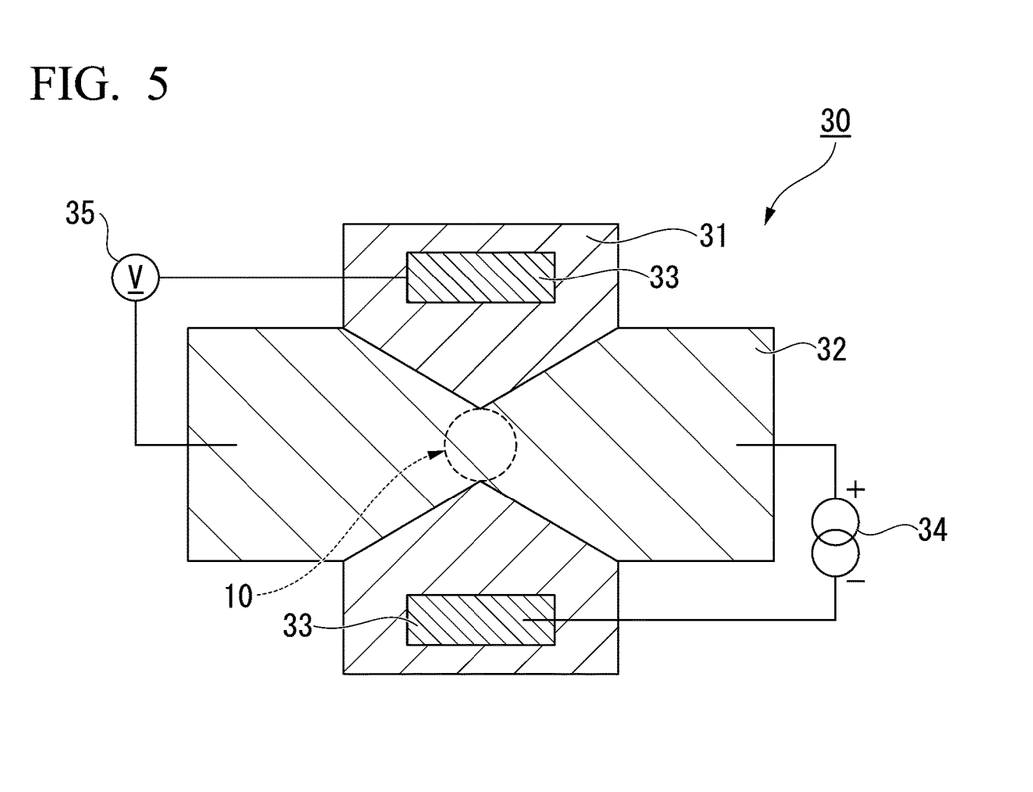
FIG. 5 is a plan view schematically illustrating a magnetoresistance effect device which is used to measure output voltage values of magnetoresistance effect elements manufactured in examples when seen in a stacking direction.

FIG. 5 is a plan view schematically illustrating a magnetoresistance effect device 30 which is used to measure the output voltage value when seen in the stacking direction. The magnetoresistance effect element 10 was disposed at a position at which a first wire 31 and a second wire 32 intersect each other. The magnetoresistance effect element 10 was formed in a columnar shape with a diameter of 80 nm. An electrode 33 was provided in the first wire 31, and the electrode 33 was connected to a power supply 34 and a voltmeter 35. By applying a voltage using the power supply 34, a current flows in the stacking direction of the magnetoresistance effect element 10. Potential differences of the magnetoresistance effect elements 10 and 20 were monitored by the voltmeter 35.

Change in resistance value of the magnetoresistance effect element 10 was observed by applying a bias voltage to the magnetoresistance effect element 10 of the magnetoresistance effect device 30 while scanning the magnetoresistance effect element with a magnetic field from the outside, and TMR(V) was calculated from the change in resistance value. TMR(V) was calculated using Equation (2).

$$TMR(V) = (R_{AP}(V) - R_P(V))/R_P(V) \times 100 \quad (2)$$

In Equation (2), $R_P(V)$ denotes resistance when the magnetization directions of the first ferromagnetic layer 2 and the second ferromagnetic layer 3 are parallel to each other at the time of application of the bias voltage. $R_{AP}(V)$ denotes resistance when the magnetization directions of the first ferromagnetic layer 2 and the second ferromagnetic layer 3 are antiparallel to each other at the time of application of the bias voltage.

The output voltage value $V_{output}$ was measured as follows. A bias voltage value $V_{Bias}$ was applied to the magnetoresistance effect element 10 of the magnetoresistance effect device 30 and TMR(V) was measured. Then, the bias voltage value $V_{Bias}$ and the acquired value of TMR(V) were substituted into Equation (1) to calculate the output voltage value $V_{output}$. The maximum value of the calculated values is described as the output voltage value in Table 1A and Table 1B.

TABLE 1A

| | First oxide layer x of $Mg_{1-x}Al_x$ alloy | Second oxide layer y of $Mg_{1-y}Al_y$ alloy | \|y − x\| | Output voltage value (V) |
|---|---|---|---|---|
| Comparative Example 1 | 0.00 | 0.00 | 0.00 | 0.18 |
| Comparative Example 2 | | 0.25 | 0.25 | 0.19 |
| Comparative Example 3 | | 0.33 | 0.33 | 0.20 |
| Comparative Example 4 | | 0.50 | 0.50 | 0.20 |
| Comparative Example 5 | | 0.67 | 0.67 | 0.21 |
| Comparative Example 6 | | 0.75 | 0.75 | 0.21 |
| Comparative Example 7 | | 1.00 | 1.00 | 0.21 |
| Comparative Example 8 | 0.25 | 0.00 | 0.25 | 0.19 |
| Comparative Example 9 | | 0.25 | 0.00 | 0.20 |
| Example 1 | | 0.33 | 0.08 | 0.30 |
| Example 2 | | 0.50 | 0.25 | 0.30 |
| Example 3 | | 0.67 | 0.42 | 0.34 |
| Example 4 | | 0.75 | 0.50 | 0.34 |
| Example 5 | | 1.00 | 0.75 | 0.34 |
| Comparative Example 10 | 0.33 | 0.00 | 0.33 | 0.20 |
| Example 6 | | 0.25 | 0.08 | 0.30 |
| Comparative Example 11 | | 0.33 | 0.00 | 0.28 |
| Example 7 | | 0.50 | 0.17 | 0.30 |
| Example 8 | | 0.67 | 0.34 | 0.34 |
| Example 9 | | 0.75 | 0.42 | 0.34 |
| Example 10 | | 1.00 | 0.67 | 0.34 |
| Comparative Example 12 | 0.50 | 0.00 | 0.50 | 0.20 |
| Example 11 | | 0.25 | 0.25 | 0.30 |
| Example 12 | | 0.33 | 0.17 | 0.30 |
| Comparative Example 13 | | 0.50 | 0.00 | 0.28 |
| Example 13 | | 0.67 | 0.17 | 0.30 |
| Example 14 | | 0.75 | 0.25 | 0.30 |
| Example 15 | | 1.00 | 0.50 | 0.30 |

TABLE 1B

| | First oxide layer x of $Mg_{1-x}Al_x$ alloy | Second oxide layer y of $Mg_{1-y}Al_y$ alloy | \|y − x\| | Output voltage value (V) |
|---|---|---|---|---|
| Comparative Example 14 | 0.67 | 0.00 | 0.67 | 0.21 |
| Example 16 | | 0.25 | 0.42 | 0.33 |
| Example 17 | | 0.33 | 0.34 | 0.33 |
| Example 18 | | 0.50 | 0.17 | 0.30 |
| Comparative Example 15 | | 0.67 | 0.00 | 0.28 |
| Example 19 | | 0.75 | 0.08 | 0.30 |
| Example 20 | | 1.00 | 0.33 | 0.30 |
| Comparative Example 16 | 0.75 | 0.00 | 0.75 | 0.21 |
| Example 21 | | 0.25 | 0.50 | 0.33 |
| Example 22 | | 0.33 | 0.42 | 0.33 |
| Example 23 | | 0.50 | 0.25 | 0.30 |
| Example 24 | | 0.67 | 0.08 | 0.30 |
| Comparative Example 17 | | 0.75 | 0.00 | 0.28 |
| Example 25 | | 1.00 | 0.25 | 0.30 |
| Comparative Example 18 | 1.00 | 0.00 | 1.00 | 0.20 |
| Example 26 | | 0.25 | 0.75 | 0.33 |
| Example 27 | | 0.33 | 0.67 | 0.33 |
| Example 28 | | 0.50 | 0.50 | 0.30 |
| Example 29 | | 0.67 | 0.33 | 0.30 |
| Example 30 | | 0.75 | 0.25 | 0.30 |
| Comparative Example 19 | | 1.00 | 0.00 | 0.24 |

From the results described in Table 1A and Table 1B, it was ascertained that the magnetoresistance effect elements of Examples 1 to 30 in which the tunnel barrier layer 4 which was a stacked body of the first oxide layer 4a and the second oxide layer 4b having disordered spinel structures with different compositions had an output voltage value higher than those of the magnetoresistance effect elements of Comparative Examples 1 to 19. The reason why the output voltage values of the magnetoresistance effect elements of Comparative Examples 1 to 8, 10, 12, 14, 16, and 18 were low is thought to be that the first oxide layer 4a or the second oxide layer 4b was an MgO layer. The reason why output voltage values of the magnetoresistance effect elements of Comparative Examples 9, 11, 13, 15, 17, and 19 were low is thought to be that the first oxide layer 4a and the second oxide layer 4b had the same composition.

Particularly, the output voltage values of the magnetoresistance effect elements of Examples 3 to 5, 8 to 10, 16 to 17, 21 to 22, and 26 to 27 were in the range of 0.33 V to 0.34 V, which is high. The reason why the output voltage values of the magnetoresistance effect elements of Examples 3 to 5 and 8 to 10 were high is thought to be that x of the first oxide layer 4a satisfied $0<x<0.5$ and y of the second oxide layer 4b satisfied $0.5<y\le1$. The reason why the output voltage values of the magnetoresistance effect elements of Examples 16 to 17, 21 to 22, and 26 to 27 were high is thought to be that x of the first oxide layer 4a satisfied $0.5<x\le1$ and y of the second oxide layer 4b satisfied $0<y<0.5$.

In Examples 4 to 5 and 9 to 10 in which x of the first oxide layer 4a stacked on the surface of the first ferromagnetic layer 2 opposite to the substrate 1 satisfied $0<x<0.5$, magnetoresistance effect elements with a high output voltage value of 0.34 V were obtained.

Examples 31 to 33, Comparative Example 20

An $Mg_{1-x1}Al_{x1}$ alloy film which is expressed by a general formula $Mg_{1-x1}Al_{x1}$ (where x1 has a value described in Table 2) was formed in a thickness of 0.8 nm on the first ferromagnetic layer 2 using a sputtering method. Subsequently, the alloy film was oxidized to form an oxide film and a heat treatment was performed thereon to form a first oxide layer 4a. The oxidization process was performed by exposing the alloy film to the air under a pressure of 5 Pa for 600 seconds. The heat treatment was performed by heating the oxide film in a vacuum at 400° C. for 15 minutes. Subsequently, an $Mg_{1-y}Al_y$ alloy film which is expressed by a general formula $Mg_{1-y}Al_y$ (where y has a value described in Table 1) was formed in a thickness of 0.8 nm on the first oxide layer 4a using a sputtering method, the alloy film was oxidized to form an oxide film, and a heat treatment was performed thereon to form a second oxide layer 4b. The conditions of the oxidization process and the heat treatment were set to be the same as in the first oxide layer 4a. Subsequently, an $Mg_{1-x2}Al_{x2}$ alloy film which is expressed by a general formula $Mg_{1-x2}Al_{x2}$ (where x2 has a value described in Table 2) was formed in a thickness of 0.8 nm on the second oxide layer 4b using a sputtering method. Subsequently, the alloy film was oxidized to form an oxide film and a heat treatment was performed thereon to form a first oxide layer 4a. The oxidization process was performed by exposing the alloy film to the air under a pressure of 5 Pa for 600 seconds. In this way, a magnetoresistance effect element 20 was manufactured in the same way as in Examples 1 to 30 and Comparative Examples 1 to 19 except that the tunnel barrier layer 4 which is a stacked body including the first oxide layer 4a, the second oxide layer 4b, and the first oxide layer 4a was stacked on the first ferromagnetic layer 2.

In the manufactured magnetoresistance effect element 20, content proportions (atomic ratios) of Mg and Al in the first oxide layer 4a and the second oxide layer 4b of the tunnel barrier layer were measured using the above-mentioned method. As a result, it was ascertained that the content proportions of Mg and Al in the first oxide layer 4a were almost the same as that in the $Mg_{1-y}Al_y$ alloy film or the $Mg_{1-x2}Al_{x2}$ alloy film and the content proportions of Mg and Al in the second oxide layer 4b were almost the same as that in the $Mg_{1-y}Al_y$ alloy film. It was also ascertained that both the first oxide layer 4a (the oxide film of the $Mg_{1-y}Al_y$ alloy film or the $Mg_{1-x2}Al_{x2}$ alloy film) and the second oxide layer 4b (the oxide film of the $Mg_{1-y}Al_y$ alloy film) had a disordered spinel structure.

An output voltage value $V_{output}$ of the manufactured magnetoresistance effect element 20 was measured as follows. The results are described in Table 2.

TABLE 2

| | First oxide layer x1 of $Mg_{1-x1}Al_{x1}$ alloy | Second oxide layer y of $Mg_{1-y}Al_y$ alloy | First oxide layer x2 of $Mg_{1-x2}Al_{x2}$ | $|y - (x1 + x2)/2|$ | Output voltage value (V) |
|---|---|---|---|---|---|
| Comparative Example 20 | 0.25 | 0.25 | 0.25 | 0.00 | 0.20 |
| Example 31 | | 0.75 | 0.25 | 0.63 | 0.35 |
| Example 32 | | 0.50 | 0.15 | 0.43 | 0.35 |
| Example 33 | 0.75 | 0.25 | 0.75 | 0.50 | 0.30 |

From the results described in Table 2, it was ascertained that the magnetoresistance effect elements of Examples 31 to 33 in which the tunnel barrier layer 4 which had an output voltage value a stacked body of the first oxide layer 4a and the second oxide layer 4b having disordered spinel structures with different compositions was higher than that of the magnetoresistance effect element of Comparative Example 20. The reason why the output voltage value of the magnetoresistance effect element of Comparative Example 20 was low is thought to be that the first oxide layer 4a and the second oxide layer 4b had the same composition.

Particularly, the output voltage values of the magnetoresistance effect elements of Examples 31 and 32 were 0.35 V, which is high. The reason why the output voltage values of the magnetoresistance effect elements of Examples 31 and 32 were high is thought to be that x of the first oxide layer 4a satisfied $0<x<0.5$ and y of the second oxide layer 4b satisfied $0.5<y\le1$.

According to the disclosure, it is possible to provide a magnetoresistance effect element with a high output voltage value.

EXPLANATION OF REFERENCES 10, 20 Magnetoresistance effect element
1 Substrate
2 First ferromagnetic layer
3 Second ferromagnetic layer
4, 24 Tunnel barrier layer
4a First oxide layer
4b Second oxide layer
30 Magnetoresistance effect device
31 First wire
32 Second wire
33 Electrode
34 Power supply
35 Voltmeter

What is claimed is:
1. A magnetoresistance effect element, comprising:
  a first ferromagnetic layer;
  a second ferromagnetic layer; and
  a tunnel barrier layer that is interposed between the first ferromagnetic layer and the second ferromagnetic layer,
  wherein the tunnel barrier layer is a stacked body including one or more first oxide layers having a spinel structure and one or more second oxide layers having a spinel structure with a composition which is different from a composition of the first oxide layer.

2. The magnetoresistance effect element according to claim 1, wherein the first oxide layer includes an oxide containing a metal or an alloy which is expressed by General Formula (I), $$A_{1-x}B_x \quad (I)$$

the second oxide layer includes an oxide containing a metal or an alloy which is expressed by General Formula (II), $$A_{1-y}B_y \quad (II), \text{ and wherein,}$$

in General Formula (I) and General Formula (II),

A's are independently Mg or Zn,

B's are independently at least one type of metal selected from the group consisting of Al, Ga, and In, and x and y satisfy $0 < x \leq 1$, $0 < y \leq 1$, and $|y-x| \geq 0.005$.

3. The magnetoresistance effect element according to claim 2, wherein x satisfies $0 < x < 0.5$ and y satisfies $0.5 < y \leq 1$, or x satisfies $0.5 < x \leq 1$ and y satisfies $0 < y < 0.5$.

4. The magnetoresistance effect element according to claim 3, wherein x satisfies $0 < x < 0.5$ and y satisfies $0.5 < y \leq 1$.

5. The magnetoresistance effect element according to claim 4, wherein the first ferromagnetic layer is formed on a substrate, the first oxide layer is stacked on a surface of the first ferromagnetic layer opposite to the substrate, and the second oxide layer is stacked on a surface of the first oxide layer opposite to the first ferromagnetic layer.

6. The magnetoresistance effect element according to claim 4, wherein the tunnel barrier layer is a stacked body which includes two first oxide layers and in which the second oxide layer is interposed between the two first oxide layers.

7. The magnetoresistance effect element according to claim 4, wherein a thickness of the first oxide layer is thinner than a thickness of the second oxide layer.

8. The magnetoresistance effect element according to claim 1, wherein a thickness of the tunnel barrier layer is equal to or less than 3 nm.

9. The magnetoresistance effect element according to claim 1, wherein the first oxide layer and the second oxide layer have a disordered spinel structure.

* * * * *